US010522232B2

(12) United States Patent
Chen et al.

(10) Patent No.: US 10,522,232 B2
(45) Date of Patent: Dec. 31, 2019

(54) MEMORY DEVICE WITH VPASS STEP TO REDUCE HOT CARRIER INJECTION TYPE OF PROGRAM DISTURB

(71) Applicant: SanDisk Technologies LLC, Plano, TX (US)

(72) Inventors: Hong-Yan Chen, San Jose, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 63 days.

(21) Appl. No.: 15/983,365

(22) Filed: May 18, 2018

(65) Prior Publication Data

US 2019/0355429 A1 Nov. 21, 2019

(51) Int. Cl.

| | |
|---|---|
| ***G11C 16/34*** | (2006.01) |
| ***G11C 16/10*** | (2006.01) |
| ***H01L 27/11524*** | (2017.01) |
| ***G11C 16/04*** | (2006.01) |
| ***H01L 29/788*** | (2006.01) |
| ***G11C 16/30*** | (2006.01) |

(52) U.S. Cl.

CPC ...... *G11C 16/3427* (2013.01); *G11C 16/0483* (2013.01); *G11C 16/10* (2013.01); *G11C 16/30* (2013.01); *H01L 27/11524* (2013.01); *H01L 29/7884* (2013.01)

(58) Field of Classification Search

CPC . G11C 16/3427; G11C 16/0483; G11C 16/10; H01L 27/11524

USPC .................................................... 365/185.17

See application file for complete search history.

(56) References Cited

U.S. PATENT DOCUMENTS

| | | | | |
|---|---|---|---|---|
| 7,372,754 | B2 | 5/2008 | Hwang et al. | |
| 8,526,233 | B2 | 9/2013 | Hemink et al. | |
| 8,625,367 | B2 | 1/2014 | Yun et al. | |
| 9,171,632 | B2 | 10/2015 | Dong et al. | |
| 9,286,987 | B1 | 3/2016 | Dong et al. | |
| 9,418,752 | B2 | 8/2016 | Rajwade et al. | |
| 9,530,506 | B2 | 12/2016 | Rabkin et al. | |
| 2008/0130360 | A1 * | 6/2008 | Kim .................. | G11C 16/0483 365/185.02 |
| 2011/0026331 | A1 | 2/2011 | Dong et al. | |

(Continued)

OTHER PUBLICATIONS

International Search Report & The Written Opinion of the International Searching Authority dated May 27, 2019, International Application No. PCT/US2019/017071.

*Primary Examiner* — Anthan Tran

(74) *Attorney, Agent, or Firm* — Vierra Magen Marcus LLP

(57) ABSTRACT

Apparatuses and techniques are described for reducing an injection type of program disturb in a memory device. A voltage on a selected word line is increased in a first step from an initial level such as 0 V to an intermediate, pass level such as Vpass, and in a second step from Vpass to a peak program level of Vpgm. A voltage on an adjacent unselected word line can be increased from the initial level to Vpass and then temporarily increased to an elevated level of Vpass_el during the second step increase on the selected word line. This helps reduce the magnitude of a channel gradient between the selected word line and the adjacent word line. The increase to Vpass_el may be implemented for program loops in the later part of a program operation, when Vpgm and the risk of program disturb is relatively high.

19 Claims, 15 Drawing Sheets

(56) References Cited

U.S. PATENT DOCUMENTS

| | | | | |
|---|---|---|---|---|
| 2011/0267913 | A1 | 11/2011 | Chung | |
| 2011/0286265 | A1* | 11/2011 | Mokhlesi | G11C 11/5628 365/185.02 |
| 2012/0300550 | A1 | 11/2012 | Hemink et al. | |
| 2013/0182505 | A1 | 7/2013 | Liu et al. | |
| 2015/0103592 | A1 | 4/2015 | Miwa | |
| 2017/0242632 | A1* | 8/2017 | Cho | G06F 3/061 |

* cited by examiner

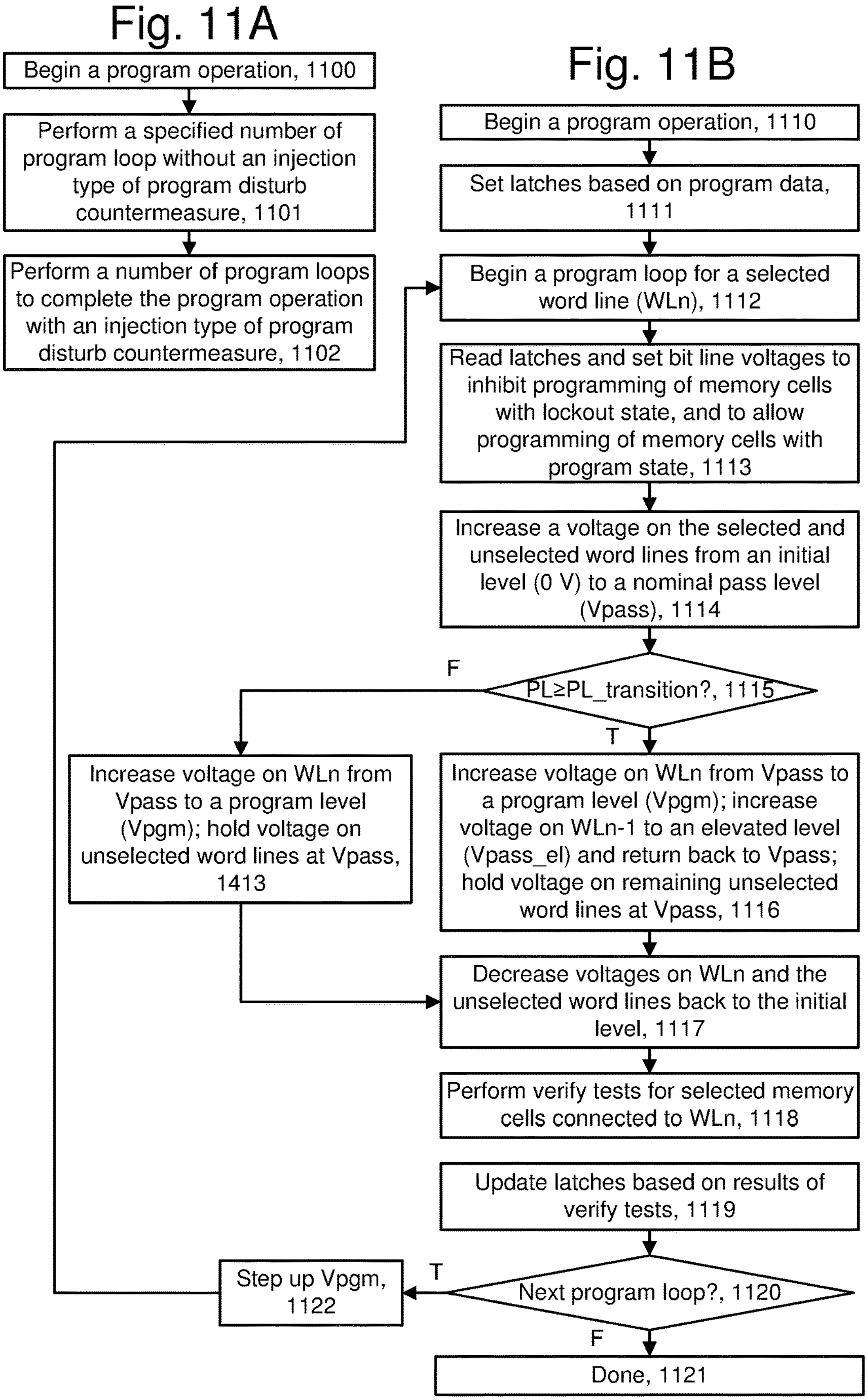
Fig. 11A
Begin a program operation, 1100
Perform a specified number of program loop without an injection type of program disturb countermeasure, 1101
Perform a number of program loops to complete the program operation with an injection type of program disturb countermeasure, 1102
Fig. 11B
Begin a program operation, 1110
Set latches based on program data, 1111
Begin a program loop for a selected word line (WLn), 1112
Read latches and set bit line voltages to inhibit programming of memory cells with lockout state, and to allow programming of memory cells with program state, 1113
Increase a voltage on the selected and unselected word lines from an initial level (0 V) to a nominal pass level (Vpass), 1114
PL≥PL_transition?, 1115
F
T
Increase voltage on WLn from Vpass to a program level (Vpgm); hold voltage on unselected word lines at Vpass, 1413
Increase voltage on WLn from Vpass to a program level (Vpgm); increase voltage on WLn-1 to an elevated level (Vpass_el) and return back to Vpass; hold voltage on remaining unselected word lines at Vpass, 1116
Decrease voltages on WLn and the unselected word lines back to the initial level, 1117
Perform verify tests for selected memory cells connected to WLn, 1118
Update latches based on results of verify tests, 1119
Next program loop?, 1120
T
Step up Vpgm, 1122
F
Done, 1121

| | Er | A | B | C | D | E | F | G |
|---|---|---|---|---|---|---|---|---|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

| | Er | A | B | C | D | E | F | G |
|---|---|---|---|---|---|---|---|---|
| UP | 1 | 1 | 1 | 1 | 1 | 1 | 1 | 1 |
| MP | 1 | 1 | 1 | 1 | 1 | 1 | 1 | 1 |
| LP | 1 | 1 | 1 | 1 | 1 | 1 | 1 | 1 |

MEMORY DEVICE WITH VPASS STEP TO REDUCE HOT CARRIER INJECTION TYPE OF PROGRAM DISTURB

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 11A depicts a programming process in which a program disturb countermeasure is used after a specified number of program loops are performed.

FIG. 11B depicts an example implementation of the programming process of FIG. 11A.

DETAILED DESCRIPTION

Figure 1A:
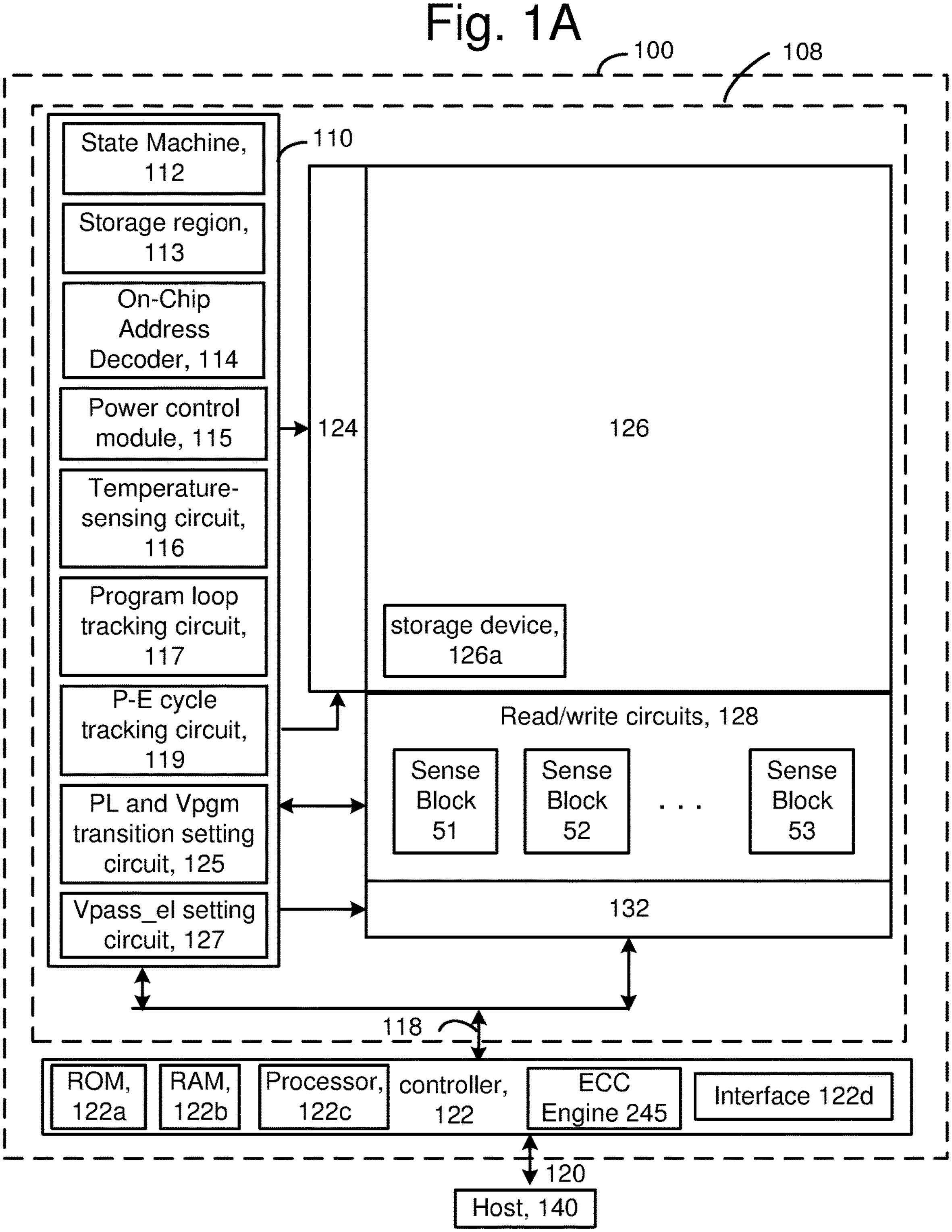
FIG. 1A is a block diagram of an example memory device.

Apparatuses and techniques are described for reducing program disturb in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 10. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 8). In a four-bit per cell memory device, there are sixteen data states including the erased state and fifteen higher data states. The data states may be referred to as the S0-S15 data states where S0 is the erased state. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells.

However, the Vth of a memory cell can change due to program disturb. Program disturb refers to inadvertent programming of memory cells. Typically, program disturb occurs for unselected memory cells connected to a selected word line during the programming of selected memory cells connected to the selected word line. The unselected memory cells have a lockout status, indicating that they are either assigned to the erased state and therefore should not be programmed, or they have completed programming to their assigned data state and therefore should not be further programmed. The selected memory cells have a program status, indicating that they should be programmed in the current program loop. Program disturb may be caused by a high control gate-to-channel voltage across the unselected memory cells due to the application of a high program voltage on the selected word line.

Another mechanism for program disturb occurs due to a change in channel voltage between the selected word line (WLn) and the adjacent word line (WLn−1) which is before WLn in a word line programming order. When the memory cells connected to WLn−1 and other word lines which precede WLn−1 in the word line programming order have a high data state (a high Vth), the associated channel voltage will be relatively low (because the channel voltage is a function of the word line voltage minus the Vth). Since the channel voltage associated with WLn will be relatively high due to the program voltage (Vpgm), there will be a significant change or gradient in the channel voltage between WLn−1 and WLn. This gradient can result in the injection of electrons into the unselected memory cells of WLn, increasing the Vth of these memory cells. See also FIG. 10A-10C. This is referred to as a hot carrier injection type of program disturb on WLn. This problem is seen particularly when the memory cells have a polysilicon channel which extends continuously in a vertical NAND string.

Techniques provided herein address the above and other issues. In one aspect, a program operation is modified to reduce a channel gradient which is formed between WLn−1 and WLn when a program pulse is applied to WLn. In one embodiment, the program pulse of WLn is applied in two steps. A first step increases the voltage from an initial level such as 0 V to an intermediate level such as Vpass, and a second step increases the voltage from the intermediate level to a peak program level, Vpgm. The voltage on WLn−1 (VWLn−1) is modified by temporarily increasing it to a level which is above Vpass during the second step increase of the voltage of WLn. See FIG. 12.

In one approach, VWLn−1 is increased from an initial level such as 0 V to Vpass (e.g., 8-10 V), and then from Vpass to an elevated pass level, Vpass_el (e.g., 2-3 V higher than Vpass). VWLn−1 is held at Vpass_el while the voltage on WLn (VWLn) is ramped up from Vpass to Vpgm. While VWLn is held at Vpgm, VWLn−1 is decreased from Vpass_el to Vpass. In another approach, VWLn−1 is increased from Vpass concurrent with the increase in VWLn from Vpass to Vpgm. Vpass is a nominal pass level, and Vpass_el>Vpass.

The time in which VWLn−1 is set to Vpass_el is minimized to avoid the likelihood of a program disturb on WLn−1 (also referred to as Vpass disturb).

In one embodiment, the likelihood of program disturb is relatively high when Vpgm is relatively high so that the temporary increase in VWLn−1 may occur for selected program loops in a program operation in which Vpgm exceeds a specified level. Such a Vpgm may be considered to be a transition program level, Vpgm_transition, and the corresponding program loop may be considered to be a transition program loop, PL_transition. See FIG. 9A. For example, this could be the last few program loops of a program pass. The temporary increase in VWLn−1 may be omitted when Vpgm does not exceed the specified level, such as during the initial program loops of the program pass.

In another aspect, the magnitude of Vpass_el can be set relatively high when Vpgm is relatively high, to reduce the increase in the channel gradient between WLn−1 and WLn due to the increase in Vpgm. See FIG. 13A.

In another aspect, a temperature of the memory device at the time of the program operation is considered. For instance, PL_transition or Vpgm_transition can be relatively low when the temperature is relatively low, due to an increased likelihood of program disturb at relatively low temperatures. See FIG. 13C. Vpass_el can also be relatively high when the temperature is relatively low. See FIG. 13D. Lowering PL_transition or Vpgm_transition results in a stronger program disturb countermeasure because Vpass_el is used in more program loops. Increasing Vpass_el also results in a stronger program disturb countermeasure because it provides a larger reduction in the channel gradient between WLn−1 and WLn.

In another aspect, PL_transition or Vpgm_transition can be adjusted based on the number of program-erase (P-E) cycles. Two program disturb factors are affected by the number of P-E cycles. First, when the number of P-E cycles is relatively high, it is easier to inject electrons into the charge trapping material of the memory cells. As a result, injection disturb on WLn, and Vpass disturb on WLn−1, can both increase. One of these factors will be stronger than the other. In one approach, it is expected that injection disturb on WLn will be stronger than Vpass disturb on WLn−1, so that an appropriate countermeasure can include setting PL_transition or Vpgm_transition relatively low when the number of P-E cycles is relatively high. See FIG. 13B. Another option is setting Vpass_el relatively high when the number of P-E cycles is relatively high. See FIG. 13E.

These and other features are discussed further below.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 115 (power control circuit), a temperature-sensing circuit 116, a program loop tracking circuit 117, a P-E cycle tracking circuit 119, a program loop (PL) and Vpgm transition setting circuit 125, and a Vpass_el setting circuit 127. A storage region 113 may be provided, e.g., for operational parameters and software/code. In one embodiment, the state machine is programmable by the software. In other embodiments, the state machine does not use software and is completely implemented in hardware (e.g., electrical circuits).

Figure 13A:
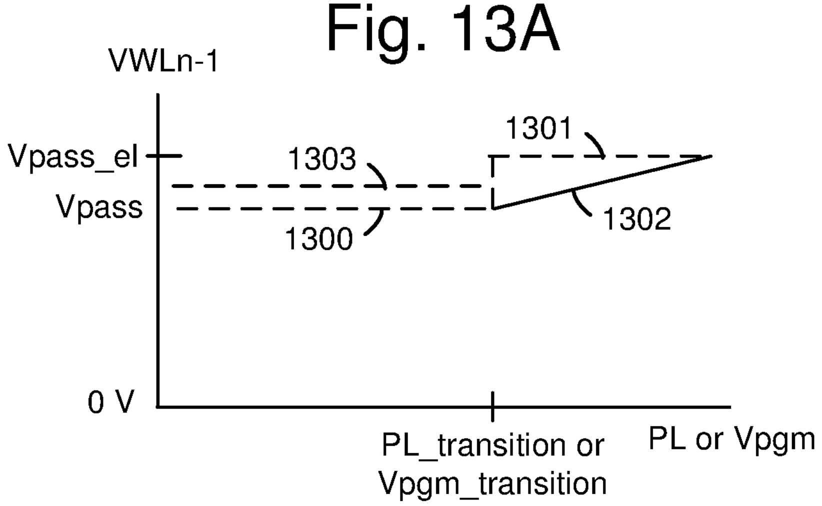
FIG. 13A depicts an example voltage on WLn−1 (VWLn−1) versus a program loop or program pulse level (Vpgm).
Figure 13C:
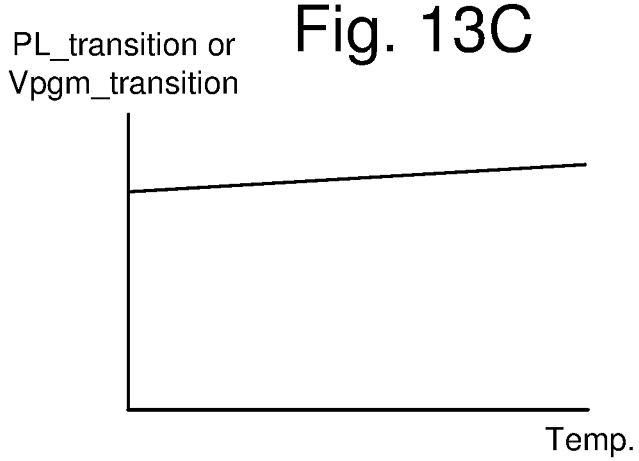
FIG. 13C depicts an example plot of a PL_transition or Vpgm_transition versus a temperature.
Figure 13B:
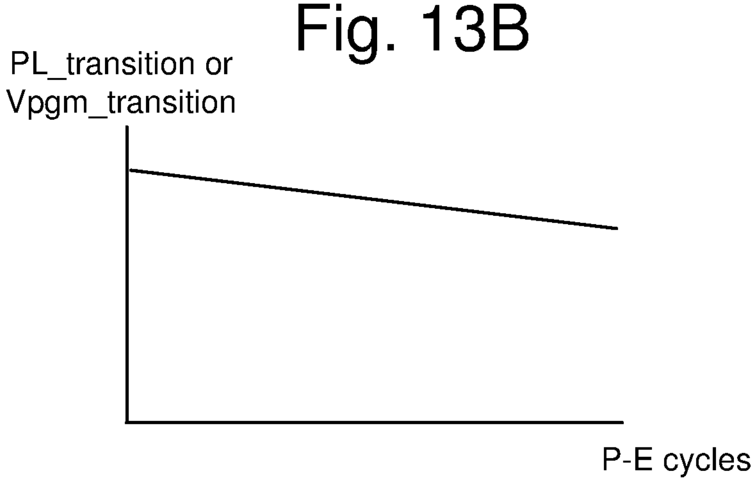
FIG. 13B depicts an example plot of a transition program loop (PL_transition) or a transition Vpgm (Vpgm_transition) versus a number of program erase (P-E) cycles.
Figure 13D:
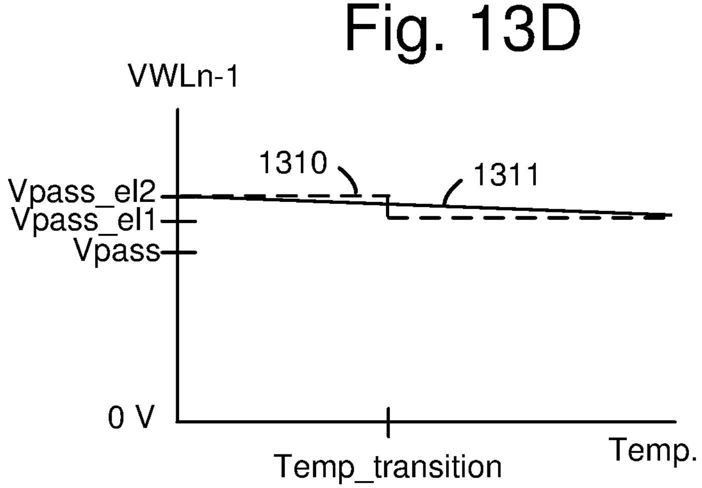
FIG. 13D depicts an example voltage on WLn−1 (VWLn−1) versus a temperature.
Figures 13E, 14A, 14B:
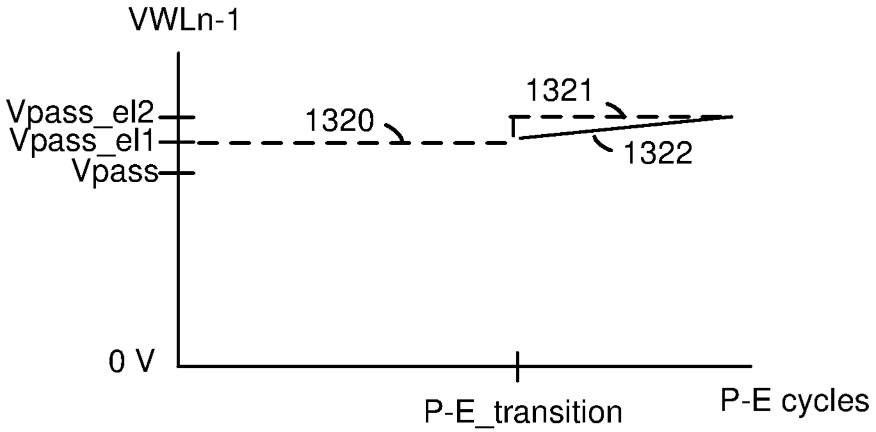
FIG. 13E depicts an example voltage on WLn−1 (VWLn−1) versus a number of P-E cycles.
FIG. 14A depicts an example of bit values in latches at a start of a program operation, consistent with FIG. 11B, step 1111.
FIG. 14B depicts bit values in latches at a completion of a program operation, consistent with FIG. 11B, step 1119.

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device at the time of a program operation, for example, for use by the PL and Vpgm transition setting circuit or the Vpass_el setting circuit 127. The program loop tracking circuit 117 can detect when a current program loop number reaches a specified number, or when a current program pulse magnitude (Vpgm) reaches a specified level. The P-E cycle tracking circuit 119 can track a number of P-E cycles which are accumulated over time by a block or other set of memory cells. The PL and Vpgm transition setting circuit 125 can set PL_transition and Vpgm_transition such as depicted in FIGS. 13B and 13C. The Vpass_el setting circuit 127 can set Vpass_el such as depicted in FIGS. 13A, 13D and 13E.

Figure 1B:
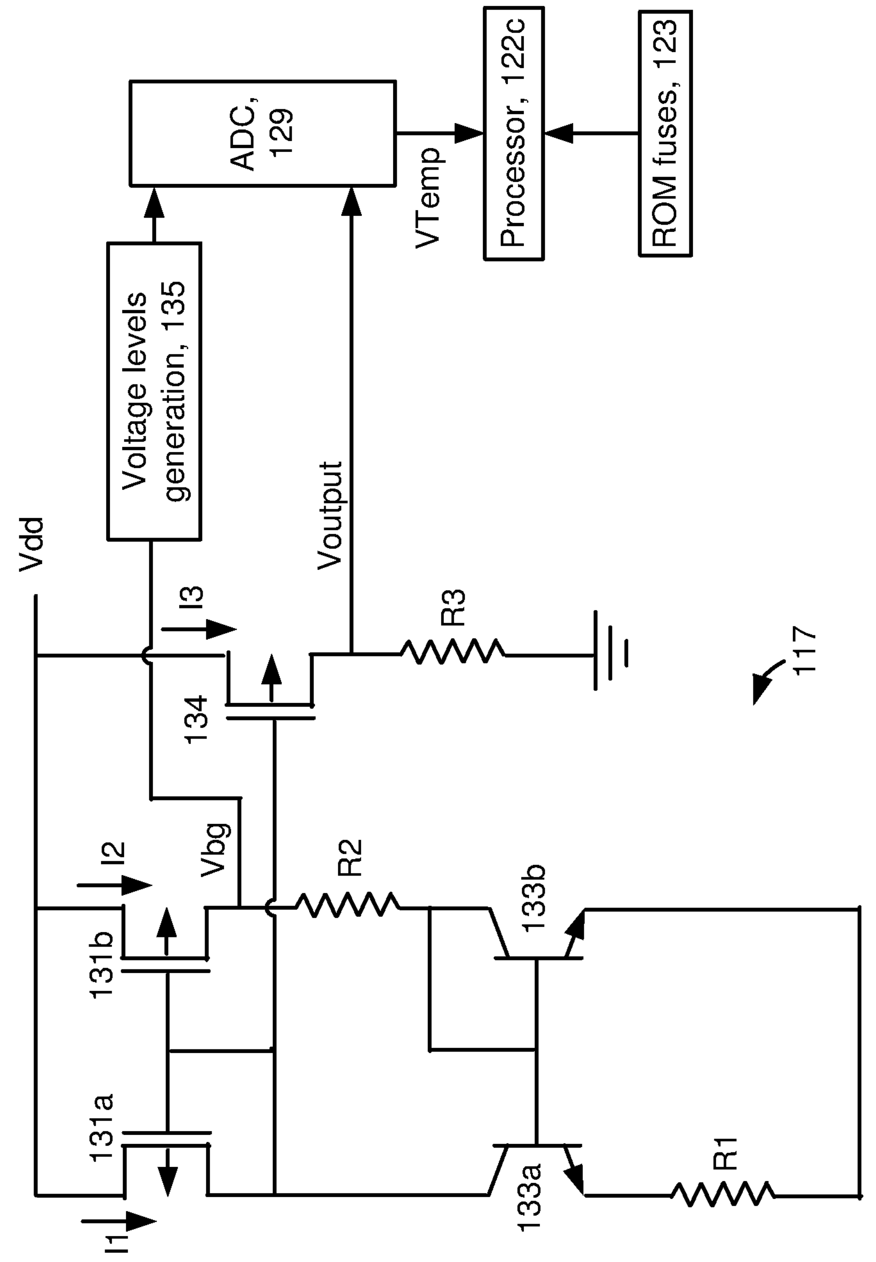
FIG. 1B depicts an example of the temperature-sensing circuit 116 of FIG. 1A.

See FIG. 1B for an example implementation of the temperature-sensing circuit. The temperature-sensing circuit, program loop tracking circuit, P-E cycle tracking circuit, PL and Vpgm transition setting circuit, and Vpass_el setting circuit, may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, program loop tracking circuit 117, P-E cycle tracking circuit 118, PL and Vpgm transition setting circuit 125, Vpass_el setting circuit 127, sense blocks 51, 52, . . . , 53, read/write circuits 128, controller 122, and so forth.

The off-chip controller 122 (which in one embodiment is an electrical circuit) may comprise a processor 122*c*, storage devices (memory) such as ROM 122*a* and RAM 122*b* and an error-correction code (ECC) engine 245. The ECC engine can correct a number of read errors.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131*a*, 131*b* and 134, bipolar transistors 133*a* and 133*b* and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122*c*. This is data indicating a temperature of the memory device. ROM fuses 123 store data which correlates the matching voltage level to a temperature, in one approach. The processor then uses the temperature to set temperature-based parameters in the memory device such as by using the PL and Vpgm transition setting circuit, and the Vpass_el setting circuit.

Vbg, is obtained by adding the base-emitter voltage (Vbe) across the transistor 131*b* and the voltage drop across the resistor R2. The bipolar transistor 133*a* has a larger area (by a factor N) than the transistor 133*b*. The PMOS transistors 131*a* and 131*b* are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131*a* and 131*b* and the current through the transistor 134 mirrors the current through the transistors 131*a* and 131*b*.

Figure 2:
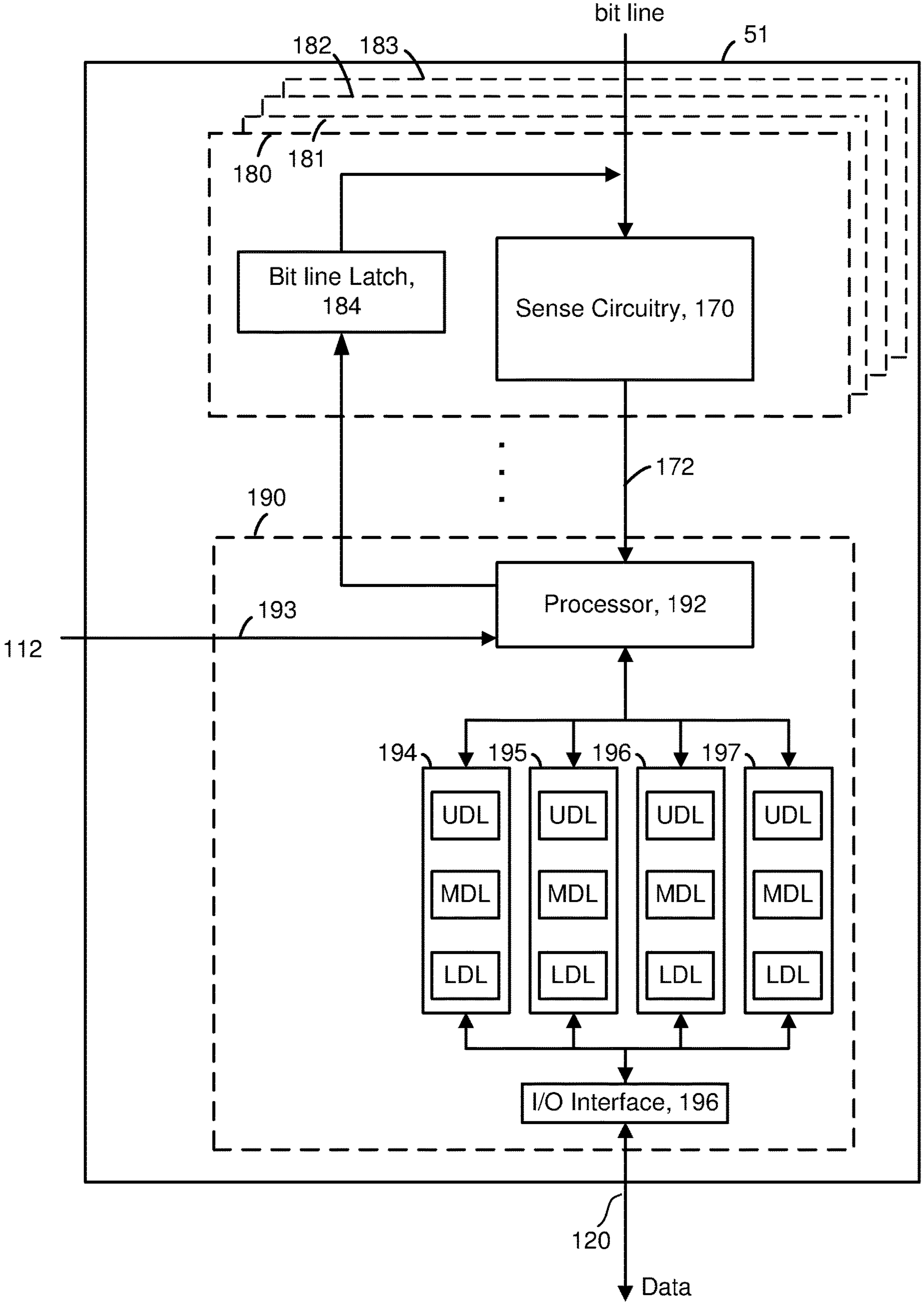
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuitry 170 that performs sensing by determining whether a conduction current in a connected bit line is above or below a predetermined threshold level. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. See also FIGS. 14A and 14B. This is in an eight-level or three-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per storage element implementation.

The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA-VvG (see FIG. 8).

Figure 3:
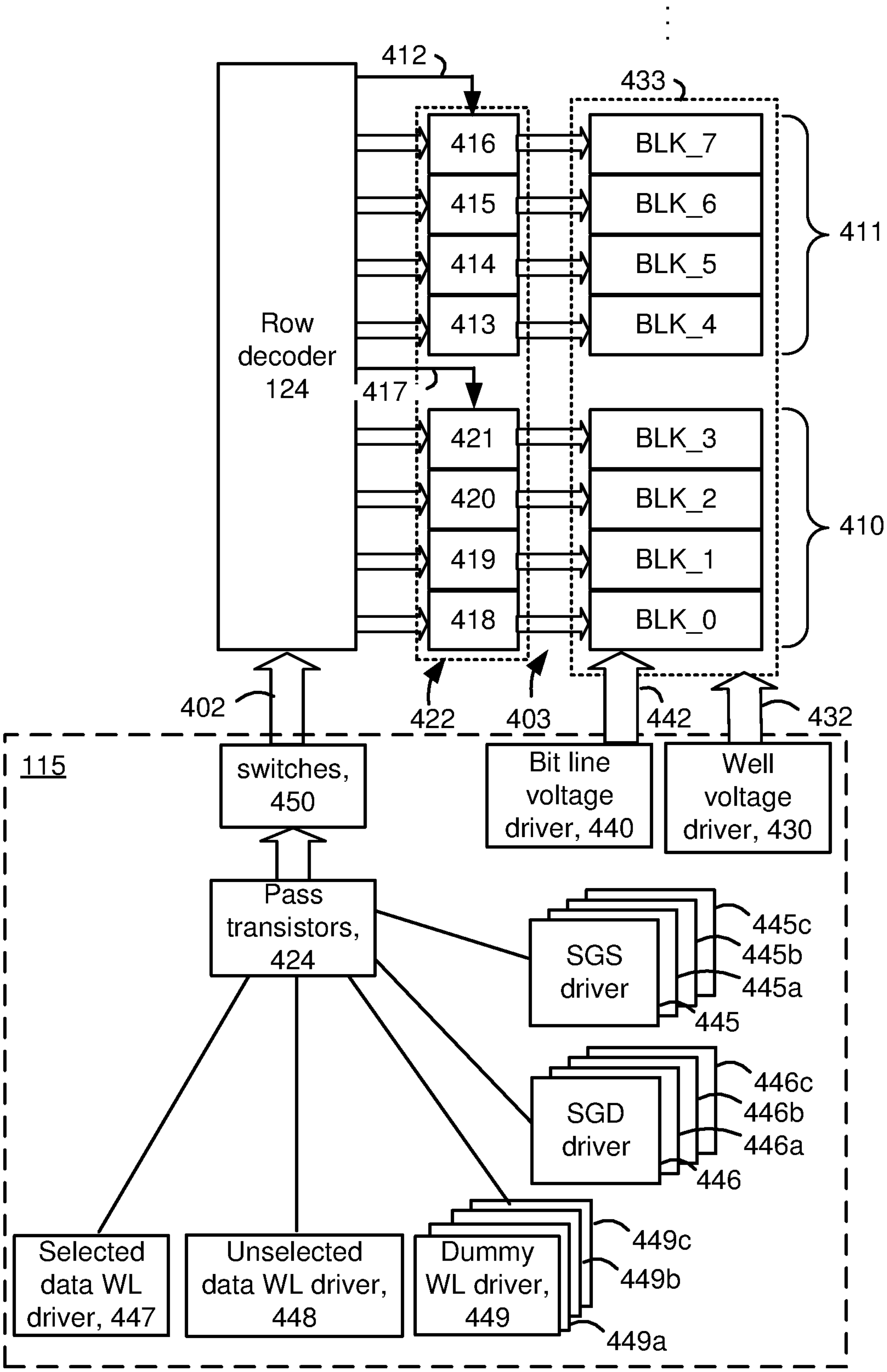
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation, a driver 448 for unselected data word lines, and dummy word line drivers 449-449*c* which provide voltages on dummy word lines. For example, the dummy word line drivers 449, 449*a*, 449*b* and 449*c* may provide voltages on the control gate layers or word line layers WLDD0, WLDD1, WLDS1 and WLDS0, respectively, in FIG. 6A.

The voltage drivers can also include separate SGS and SGD drivers for each sub-block. For example, SGS drivers 445, 445*a*, 445*b* and 445*c*, and SGD drivers 446, 446*a*, 446*b* and 446*c* can be provided for SB0, SB1, SB2 and SB3, respectively, such as in FIG. 7. In another option, one SGS driver is common to the different sub-blocks in a block.

The various components, including the row decoder, may receive commands from a controller such as the state machine 112 or the controller 122 to perform the functions described herein.

The well voltage driver 430 provides a voltage Vsl to the well region 611*a* in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 4 to 7, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
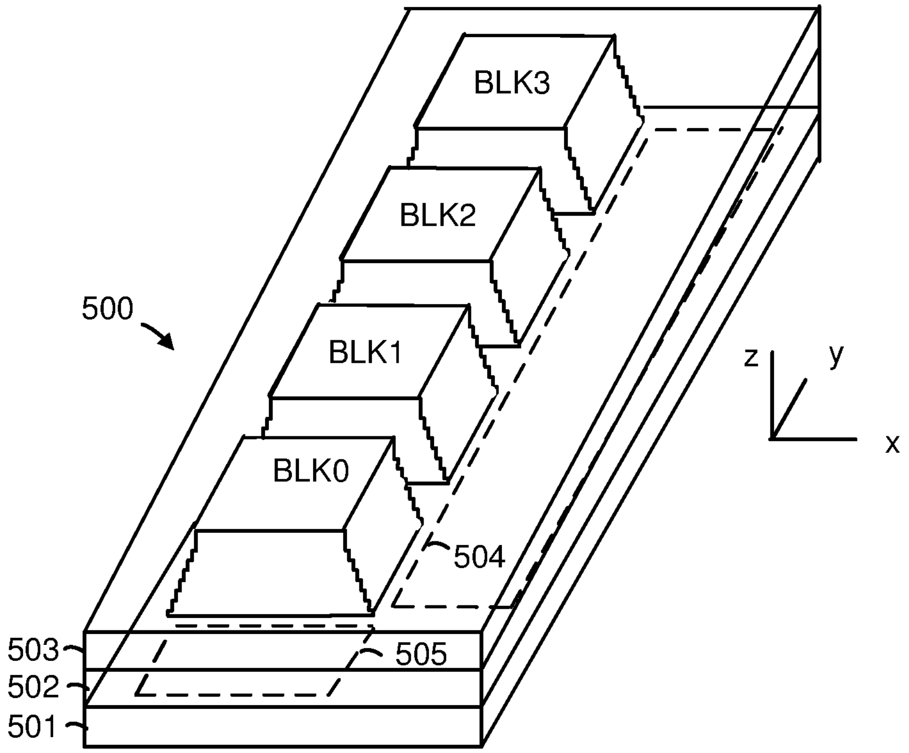
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
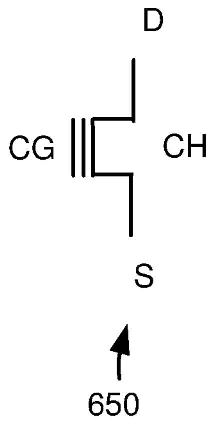
FIG. 5 depicts an example transistor 650.

FIG. 5 depicts an example transistor 650. The transistor comprises a control gate CG, a drain D, a source S and a channel CH and may represent a memory cell or a select gate transistor, for example.

Figure 6A:
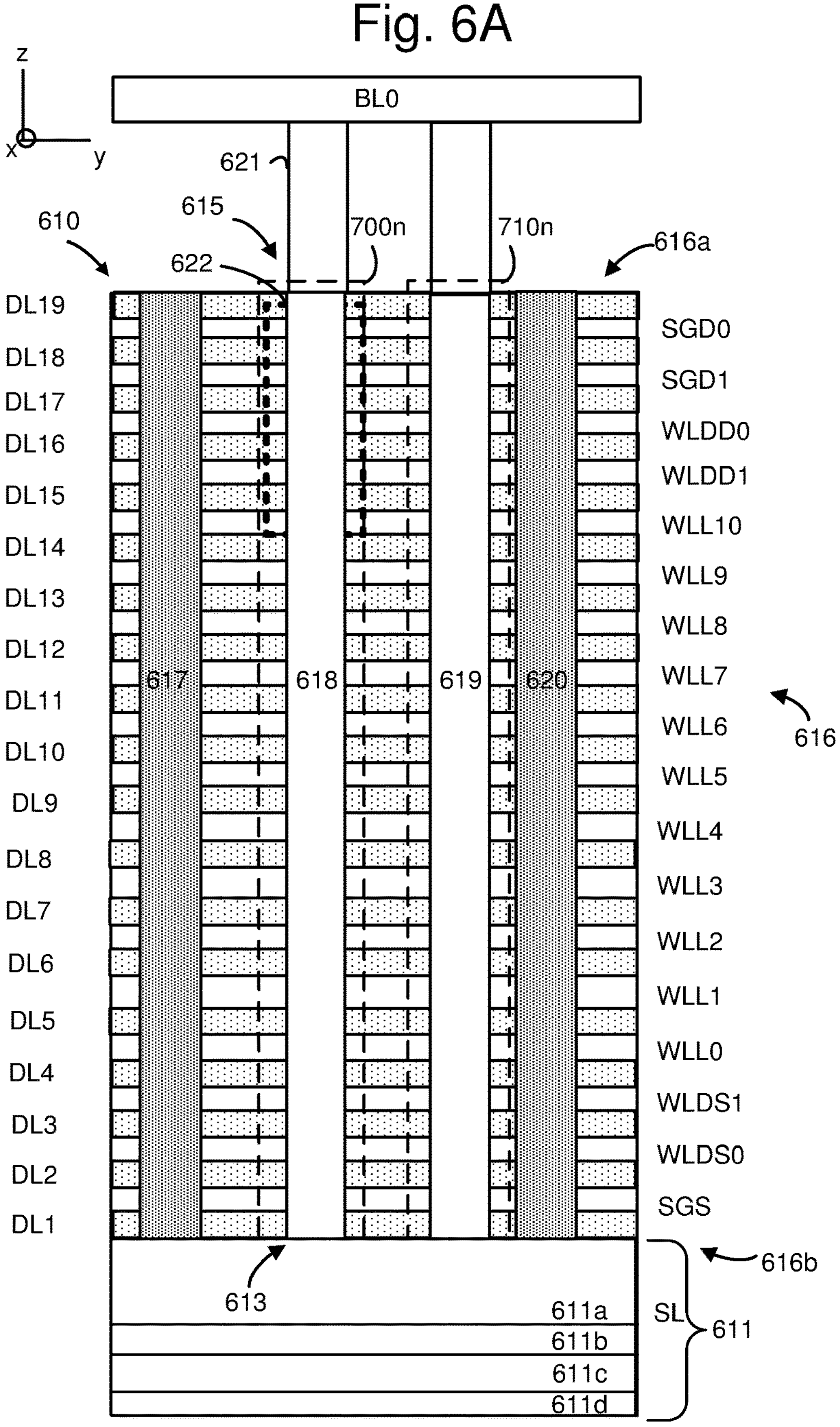
FIG. 6A depicts an example cross-sectional view of a portion of the block BLK0 of FIG. 4.

FIG. 6A depicts an example cross-sectional view of a portion of the block BLK0 of FIG. 4. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings 700*n* and 710*n* are depicted. Each NAND string encompasses a memory hole 618 or 619 which is filled with materials which form memory cells adjacent to the word lines. Region 622 of the stack is shown in greater detail in FIG. 6B.

The stack includes a substrate 611. In one approach, a portion of the source line SL comprises a well region 611*a* as an n-type source diffusion layer or well in the substrate. The well region is in contact with a source end of each string of memory cells in a block. An erase pulse may be applied to this layer in an erase operation. The n-type well region 611*a* is formed in a p-type well region 611*b*, which in turn is formed in an n-type well region 611*c*, which in turn is formed in a p-type semiconductor substrate 611*d*, in one possible implementation. The n-type source diffusion layer may be shared by all of the blocks in a plane, in one approach.

NAND string 700*n* has a source-end 613 at a bottom 616*b* of the stack 616 and a drain-end 615 at a top 616*a* of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

Figure 6B:
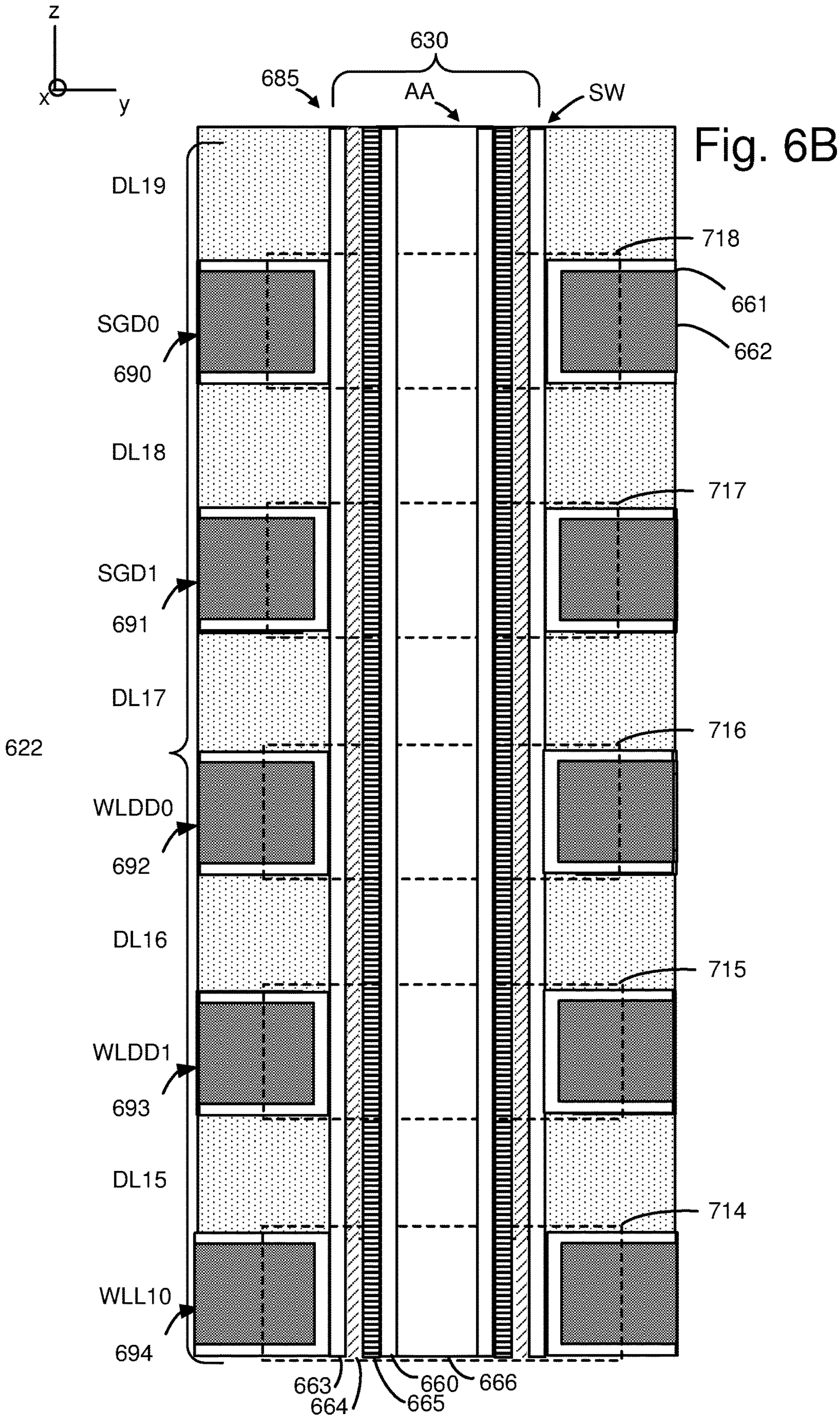
FIG. 6B depicts a close-up view of the region 622 of the stack of FIG. 6A.

FIG. 6B depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. These SGD transistors are at the drain end of the NAND string.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride ($Si_3N_4$) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700*a*, 710*a*, 720*a* and 730*a* extend continuously in the NAND strings 700*n*, 710*n*, 720*n* and 730*n*, respectively. The channel 700*a* extends continuously in the NAND strings 700*n* from the SGS transistor 701 to the SGD transistors 717 and 718. The channel 700*a* is continuous in that it is uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

Figure 7:
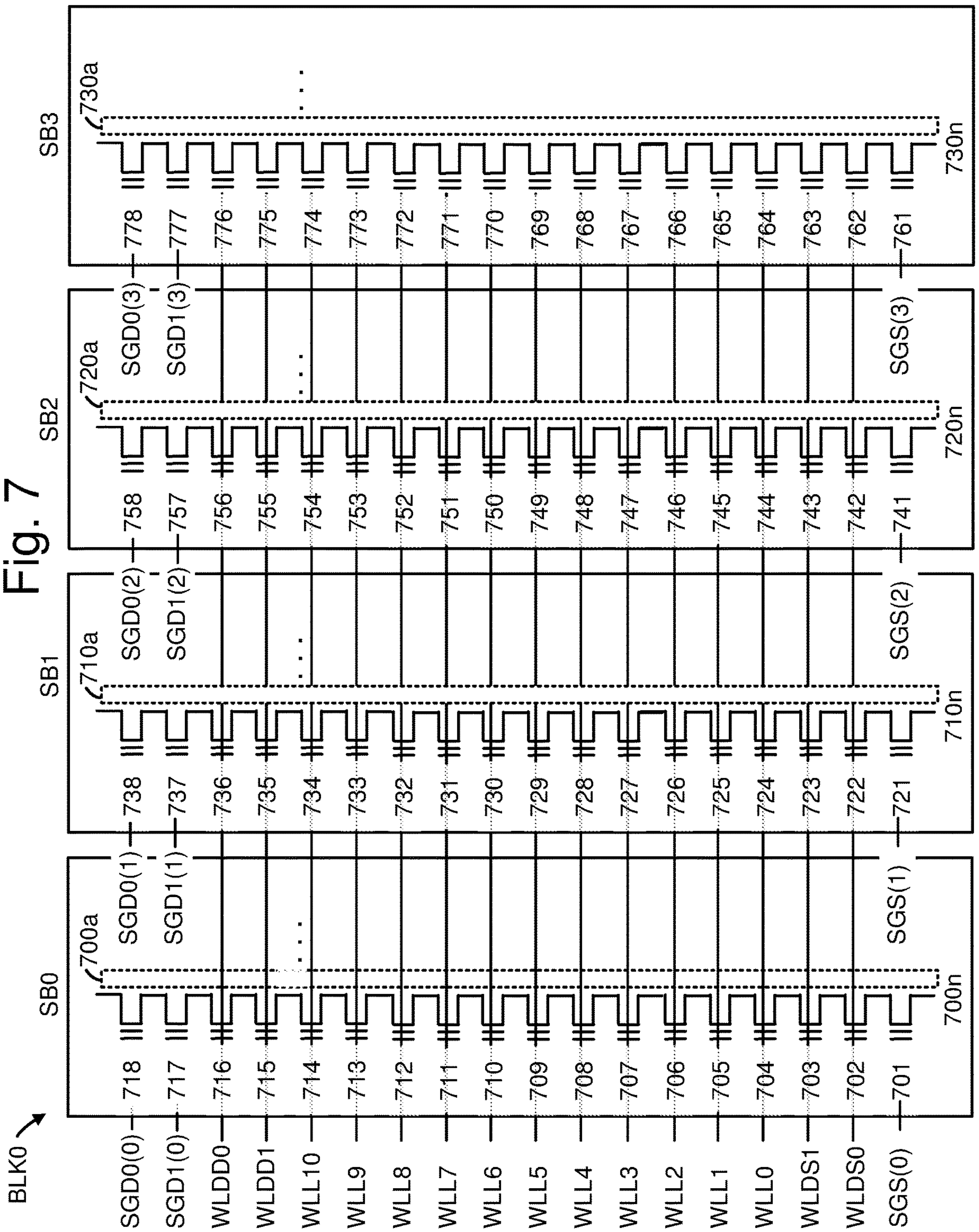
FIG. 7 depicts an example view of NAND strings in a block BLK0 which is consistent with FIGS. 4 and 6A.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700*n*, 710*n*, 720*n* and 730*n*, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700*n*, 710*n*, 720*n* and 730*n* are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WLL0 in SB0, SB1, SB2 and then SB2, then programming WLL1 in SB0, SB1, SB2 and then SB2, and so forth. Another option programs all of the memory cells in one sub-block, one word line at a time, before programming the memory cells of the next sub-block. For example, this can involve programming WLL0, then WLL1 and so forth in SB0, followed by programming WLL0, then WLL1 and so forth in SB1, and so forth. The word line programming order may start at WL0, the source-end word line and end at WLL10, the drain-end word line, for example.

The NAND strings 700*n*, 710*n*, 720*n* and 730*n* have channels 700*a*, 710*a*, 720*a* and 730*a*, respectively.

Additionally, NAND string 700*n* includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710*n* includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720*n* includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730*n* includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by separate control lines SGS(0), SGS(1), SGS(2) and SGS(3), respectively. In another approach, all of the SGS transistors in a block are connected and commonly driven.

Figure 8:
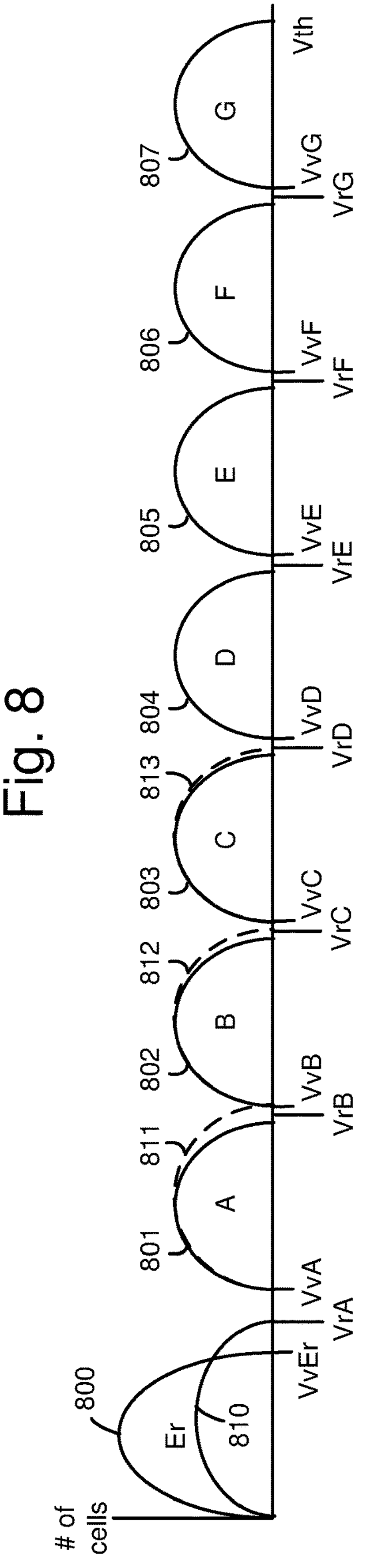
FIG. 8 depicts example Vth distributions of a set of memory cells with and without program disturb.

FIG. 8 depicts example Vth distributions of a set of memory cells with and without program disturb. The vertical axis depicts a number of memory cells on a logarithmic scale, and the horizontal axis depicts a Vth of the memory cells on a linear scale. In one approach, at a start of a program operation, the memory cells are all initially in the erased state, as represented by the Vth distribution 800. After the program operation is successfully completed, the memory cells assigned to the A-G states are represented by the Vth distributions 801-807.

The memory cells which are programmed to the A, B, C, D, E, F and G using verify voltages of VvA, VvB, VvC, VvD, VvE, VvF and VvG, respectively, are represented by the Vth distributions 801, 802, 803, 804, 805, 806 and 807, respectively. These Vth distributions are obtained just after completion of the program operation, and assume no program disturb has occurred. The verify voltages are used in the program-verify tests of the memory cells. Read voltages VrA, VrB, VrC, VrD, VrE, VrF and VrG can be used for reading the states of the memory cells in a read operation. These verify voltages and read voltages are examples of control gate read levels of the selected word line voltage.

However, due to program disturb, the Vth of the data memory cells can shift higher, as represented by the Vth distributions 810, 811, 812 and 813 for the Er, A, B and C data states, respectively. The amount of program disturb (amount of Vth upshift at the upper tail of the Vth distribution) is relatively larger for the relatively lower data states. The relatively high data states of D-G in this example are assumed to have no program disturb, as a simplification. The techniques described herein for reducing program disturb can reduce the amount of Vth upshift.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied to the word lines.

The Er-G states are examples of assigned data states, and the A-G states are examples of programmed data states, in this eight state example. The number of data states could be higher or low than eight data states.

Figure 9A:
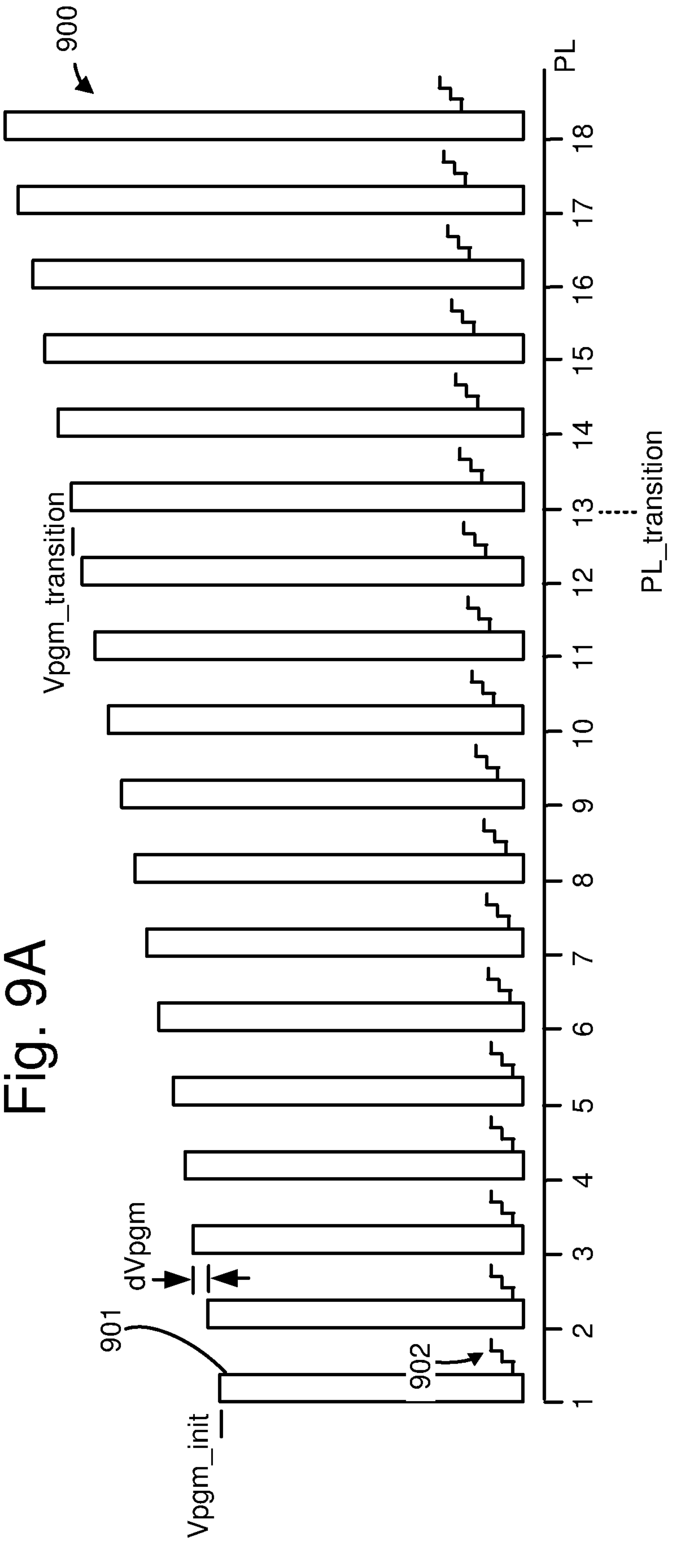
FIG. 9A depicts an example voltage signal in a program operation.

FIG. 9A depicts an example voltage signal in a program operation. The voltage signal can be used in a single pass program operation or in one pass of a multi-pass program operation. The program operation can be used to program memory cells to threshold voltages such as depicted in FIG. 8. The horizontal axis denotes a program loop (PL) number, ranging from 1-18, and the vertical axis denotes voltage. During a program operation, program loops are performed for a selected word line in a selected sub-block. A program loop comprises a program portion in which a program voltage or pulse is applied to the selected word line followed by a verify portion in which a verify signal or pulse is applied to the selected word line while one or more verify tests, referred to as program-verify tests, are performed for the associated memory cells. Other than the erased state, each assigned state has a verify voltage which is used in the verify test for the state in a program operation.

The voltage signal 900 includes a series of program voltages, including an initial program voltage 901, which are applied to a word line selected for programming. In this example, the voltage signal includes program voltages which increase stepwise in amplitude in one or more program loops of a programming pass using a fixed or varying step size. This is referred to as incremental step pulse programming, where the program voltage (Vpgm) starts at an initial level, Vpgm_init, and increases in a step in each successive program loop, for instance, until the program operation is completed. A fixed step size of dVpgm is depicted. A successful completion occurs when the threshold voltages of the selected memory cells reach the verify voltages of the assigned data states. A program operation can include a single programming pass or multiple programming passes, where each pass uses incremental step pulse programming, for instance.

Figure 9B:
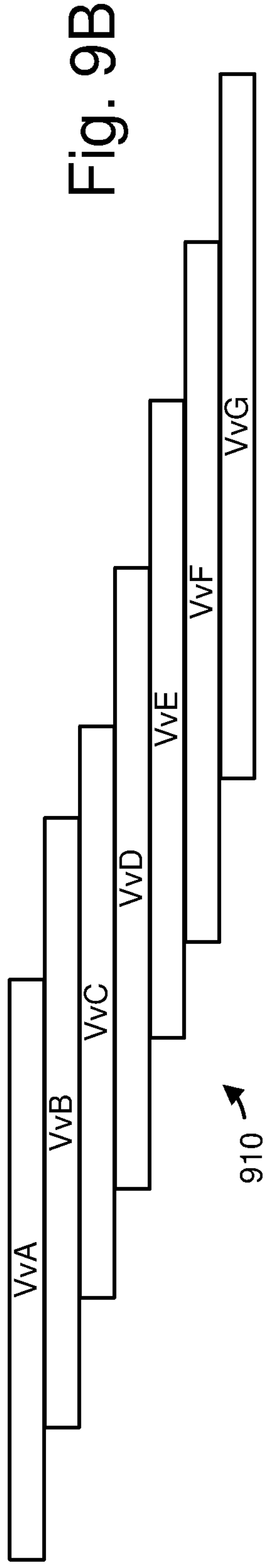
FIG. 9B depicts an example of verify voltages used in different program loops of FIG. 9A.

The verify signal in each program loop, including example verify signal 902, can include one or more verify voltages, based on the assigned data states which are being verified for the program loop. The verify tests can encompass lower assigned data states and then midrange assigned data states and then higher assigned data states as the program operation proceeds, such as depicted in FIG. 9B. The example verify signals depict three verify voltages as a simplification.

All memory cells may initially be in the erased state at the beginning of the program operation, for instance. After the program operation is completed, a Vth distribution similar to that in FIG. 8 is achieved, and the data can be read from the memory cells using read voltages which are between the Vth distributions. At the same time, a read pass voltage, Vpass (e.g., 8-10 V), also referred to as pass voltage or turn on voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the Er, A, B, C, D, E, F and G states is 111, 110, 100, 000, 010, 011, 001 and 101, respectively. In each three-bit sequence, the UP bit is followed by the MP bit and then the LP bit. The data of the lower, middle and upper pages can be determined by reading the memory cells using read voltages of VrA and VrE; VrB, VrD and VrF; and VrC and VrG, respectively.

FIG. 9B depicts an example of verify voltages used in different program loops of FIG. 9A. The horizontal bars are time-aligned with the program loop axis of FIG. 9A. The set of verify voltages 910 includes VvA, VvB, VvC, VvD, VvE, VvF and VvG used in program loops 1-7, 2-9, 4-10, 5-12, 7-14, 8-16 and 10-18, respectively.

Figure 10A:
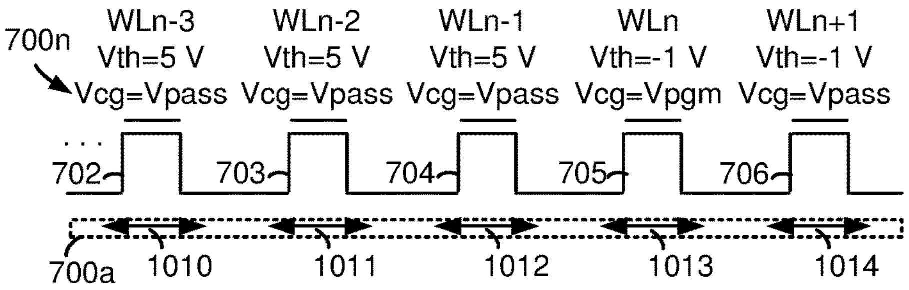
FIG. 10A depicts a portion of the NAND string **700*n* and its channel 700*a* of FIG. 7**, showing control gate voltages and threshold voltages when a program pulse is applied.

FIG. 10A depicts a portion of the NAND string 700*n* and its channel 700*a* of FIG. 7, showing control gate voltages and threshold voltages when a program pulse is applied. The problem of the injection type of program disturb occurs in particular when there are one or more previously programmed word lines (on the source side of WLn) having memory cells in a high data state. For generality, a selected word line is referred to as WLn. Program disturb occurs for unselected memory cells connected to WLn in unselected NAND strings. The program disturb occurs during programming of selected memory cells connected to WLn in selected NAND strings. For instance, the NAND string 700*n* of FIG. 7 (along with NAND strings 720*n* and 730*n*) may be an unselected NAND string, and the NAND string 710*n* of FIG. 7 may be a selected NAND string.

In this example, WLn=WL5, so that WLn−1, WLn−2 and WLn−3 refer to WL4, WL3 and WL2, respectively, and WLn+1 refers to WL6. The memory cells 702, 703, 704, 705 and 706 of the NAND string have associated, adjacent channel regions 1010, 1011, 1012, 1013 and 1014, respectively.

Also in this example, the memory cells 702-704 have been programmed to the highest data state, e.g. the G state and therefore have a relatively high Vth=5 V. This represents a worst case scenario in that it results in the largest channel gradient between WLn−1 and WLn, compared to other data patterns. Although the data states are usually randomly distributed among the memory cells, a scenario close to the worst case scenario may occur for many unselected NAND strings. The memory cells 705 and 706 have not yet been programmed and are in the erased state, having Vth=−1 V, for example. Voltages are applied to the word lines during a program operation. The voltages include Vpass (e.g., 8-10 V) applied to the unselected word line, e.g., WLn−3, WLn−2, WLn−1 and WLn+1, and a program pulse of Vpgm (e.g., 15-25 V) applied to WLn.

Figure 10B:
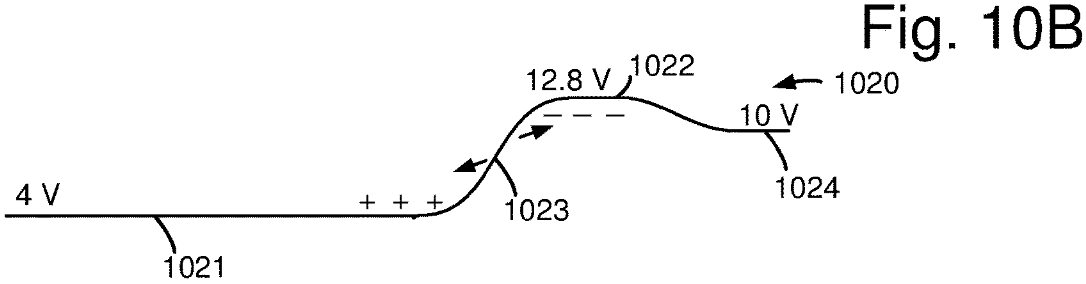
FIG. 10B depicts a plot of a channel voltage in the NAND string in FIG. 10A when a program pulse is applied, when a program disturb countermeasure is not used.

FIG. 10B depicts a plot of a channel voltage in the NAND string in FIG. 10A when a program pulse is applied, when a program disturb countermeasure is not used. A plot 1020 represents a magnitude of the channel voltage for the different channel regions. A vertical direction indicates voltage and a horizontal direction indicates time. For each memory cell, the voltage (Vch) in the associated channel region will be approximately equal to: (Vcg−Vth)×CR, where Vcg is the control gate or word line voltage, Vth is the threshold voltage and CR is a control gate-to-channel coupling ratio such as 0.8 Thus, with Vcg=10 V and Vth=5 V, Vch=4 V for the channel regions 1010-1012 as represented by plot 1021. With Vpgm=15 V, for example the voltage of the channel region 1013 will exceed 10 V. For example, the voltage of the channel region 1013 may be 15−(−1)=16 V×0.8=12.8 V, as represented by plot 1022. Due to the significant difference in the voltages of the adjacent channel regions 1012 and 1013 for WLn−1 and WLn, respectively, there will be a gradient in the channel voltage as represented by plot 1023. This gradient is sufficient to generate electron-hole pairs in the channel. The holes are denoted by "+" and the electrons are denoted by "−". The electrons are attracted to the memory cell 705 due to the high control gate voltage (Vpgm) and may be drawn or injected into the charge trapping material of the memory cell 705, causing program disturb. The holes will gradually dissipate as the channel voltage normalizes under WLn−3 to WLn−1.

Figure 12:
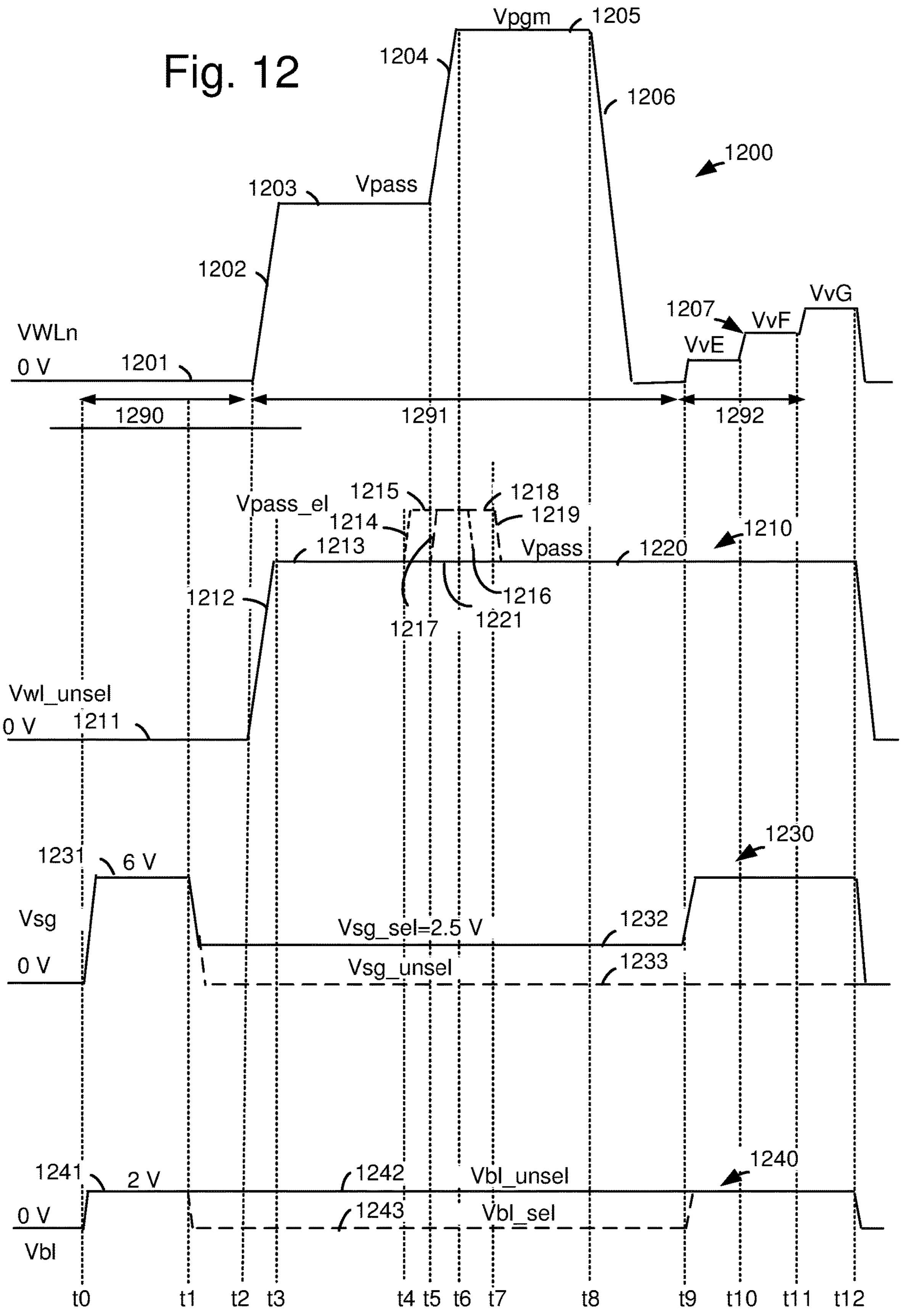
FIG. 12 depicts examples of voltage signals which can be used in a program loop of a program operation, consistent with FIGS. 11A and 11B.

The voltage of the channel region 1014 of WLn+1 will be slightly lower than the voltage under the channel region 1013 of WLn, and is affected by factors such as the bit line pre-charge level. The voltage of the channel region 1014 could be about 8-10 V, for example, as represented by a plot 1024. In particular, the memory cells on the drain side of WLn are in the erased state, and not yet programmed yet. Before the word line voltages are increased from the initial level, the drain side channel voltage is usually about 0-2 V due to pre-charge caused by Vbl=2 V, for example. See FIG. 12, plot 1231. When the voltage of the unselected word lines ramps up to 10 V, for instance, there will be an increase of 8 V in the drain side channel voltage boost, assuming a 0.8 coupling ratio. So the final drain side channel voltage may reach 10 V. The WL to WLn+1 channel gradient will be 12.8−10=2.8 V, for instance, which is significantly smaller than the WL to WLn−1 channel gradient of 12.8-6.4=6.4 V. Accordingly, the likelihood of the injection type of program disturb from the drain side of WLn is small. The source side of WLn refers to word lines between WLn and the SGS transistors of a NAND string, while the drain side of WLn refers to word lines between WLn and the SGD transistors of a NAND string.

Figure 10C:
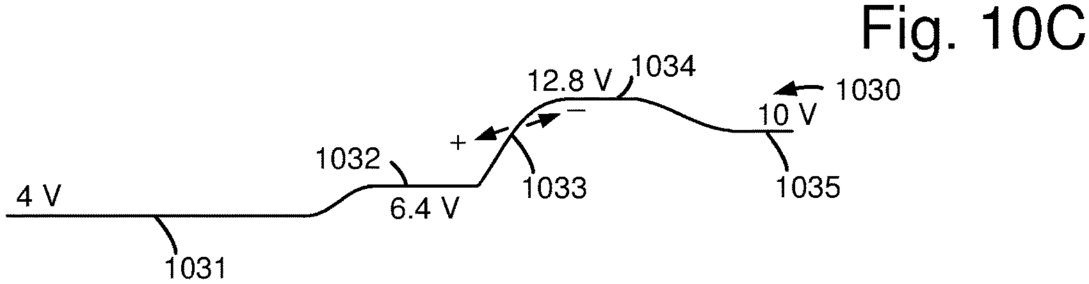
FIG. 10C depicts a plot 1030 of a channel voltage in the NAND string in FIG. 10A when a program pulse is applied, when a program disturb countermeasure is used.

FIG. 10C depicts a plot 1030 of a channel voltage in the NAND string in FIG. 10A when a program pulse is applied, when a program disturb countermeasure is used. The Vpass voltage on WLn−1 is replaced by the higher Vpass_el (e.g., 10-13 V), so that the voltage of the channel region 1012 is increased from 4 V to about 6.4 V, as represented by a plot 1032. That is, Vch=(13-5 V)×0.8=6.4 V. As a result, the gradient or difference in channel voltage between WLn−1 and WLn (as represented by a plot 1033) is reduced by 2.4 V. This reduces the amount of electron-hole pairs which are generated so that program disturb of the WLn memory cells is also reduced. Generally, Vpass_el should be sufficiently high to reduce the channel gradient to an extent that injection disturb of the WLn memory cells is reduced. However, Vpas s_el should not be too high to avoid a significant increase in the Vpass disturb of the WLn−1 memory cells. In one approach, the elevated pass level (Vpass_el) is up to 30% higher than the nominal pass level (Vpass), and the program level (Vpgm) is at least 50% higher than the nominal pass level. For example, with Vpass=10 V, Vpass_el may be up to 13 V. Vpgm may have an initial value of 15 V, which is 50% higher than Vpass=10 V.

The voltage of the channel regions 1010 and 1011 is 4 V (as represented by plot 1031), the voltage of the channel region 1013 is 12.8 V (as represented by plot 1034), and the voltage of the channel region 1014 is 10 V, as in FIG. 10B (as represented by a plot 1035).

Figure 10D:
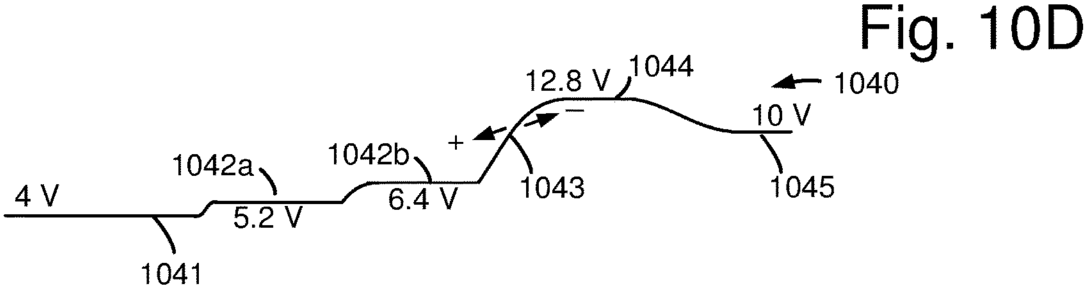
FIG. 10D depicts a plot 1040 of a channel voltage in the NAND string in FIG. 10A when a program pulse is applied, when another program disturb countermeasure is used.

FIG. 10D depicts a plot 1040 of a channel voltage in the NAND string in FIG. 10A when a program pulse is applied, when another program disturb countermeasure is used. In this example, the voltages of WLn−1 and WLn−2 are elevated relative to the nominal levels, and the voltage of WLn−1 is higher than the voltage of WLn−2. This approach results in a more gradual change in the channel voltage. In one example, VWLn−1=13 V as in FIG. 10C, and VWLn−2=11.5 V, as examples of respective elevated pass levels. The voltage of the channel region 1011 is (11.5−5 V)×0.8=5.2 V. The voltages of the channel regions 1010, 1011, 1012, 1013 and 1014 are represented by plots 1041, 1042*a*, 1042*b*, 1044 and 1045, respectively. The channel gradient between WLn−1 and WLn is represented by a plot 1043.

In one embodiment, a second unselected word line (WLn−2) is adjacent to a first unselected word line (WLn−1), wherein the second unselected word line is programmed before the first word line, the first unselected word line is programmed before the selected word line (WLn). A control circuit is configured to provide a voltage on the second unselected word line at an elevated pass level (Vpass_el, e.g., 11.5 V) during the increase of the voltage on the selected word line (WLn), and at the nominal pass level (Vpass) during the hold of the voltage on the selected word line, and the elevated pass level of the second unselected word line (e.g., 11.5 V) is lower than the elevated pass level of the first unselected word line (e.g., 13 V).

FIG. 11A depicts a programming process in which a program disturb countermeasure is used after a specified number of program loops are performed. As mentioned, the injection type of program disturb is more likely to occur when Vpgm is relatively high, since the electrons are attracted to the charge trapping regions of the WLn memory cells in proportion to the magnitude of the control gate voltage of WLn. In an incremental step pulse programming operation such as shown in FIG. 9A, Vpgm increases in each successive program loop after the initial program loop. Accordingly, the likelihood of the injection type of program disturb is greater toward the end of a program operation, when Vpgm is relatively high, compared to the beginning of the program operation, when Vpgm is relatively low.

Step 1100 begins a program operation. Step 1101 includes performing a specified number of program loops without an injection type of program disturb countermeasure. Step 1102 includes performing a number of program loops to complete the program operation (or program pass) with an injection type of program disturb countermeasure. For example, in FIG. 9A, program loops 1-12 are encompassed by step 1101 and program loops 13-18 are encompassed by step 1102.

FIG. 11B depicts an example implementation of the programming process of FIG. 11A. Step 1110 begins a program operation. Step 1111 sets latches for the selected memory cells based on program data. See also FIGS. 2 and 14A. Step 1112 begins a program loop. Step 1113 includes reading the latches of the selected memory cells, e.g., to determine whether the memory cells are in a lockout or program state. The step also includes setting bit line voltages to inhibit programming of memory cells with the lockout state, e.g., by setting Vbl=2 V, and to allow programming of memory cells with the program state, e.g., by setting Vbl=0 V. Step 1114 includes increasing a voltage on the selected and unselected word lines from an initial level (e.g., 0 V) to a nominal pass level, Vpass. See FIG. 12 at t2-t3.

A decision step 1115 determines if PL≥PL_transition. If the decision step is false, step 1413 increase the voltage on WLn from Vpass to a program level (Vpgm) and holds the voltage on the unselected word lines at Vpass. See FIG. 12 at t5-t9. If the decision step is true, step 1116 increases the voltage on WLn from Vpass to a program level (Vpgm), increases the voltage on WLn−1 to an elevated pass level (Vpass_el) and returns the voltage back to Vpass, and holds the voltage on the remaining unselected word lines at Vpass. WLn−1 thus experiences a temporary increase of its voltage. To implement step 1116, one option involves increasing the voltage on WLn−1 to Vpass_el before increasing the voltage on WLn to Vpgm. See FIG. 12, plots 1214-1216. Another option involves increasing the voltage on WLn−1 to Vpass_el concurrent with the increase of the voltage on WLn to Vpgm. See FIG. 12, plots 1217-1219.

Step 1117 involves decreasing the voltages on WLn and the unselected word lines back to the initial level. See FIG. 12 at t8. Step 1118 includes performing verify tests for selected memory cells connected to WLn. Step 1119 includes updating the latches based on the results of the verify tests. For example, the latches can be updated from the program state to the lockout state for memory cells which pass a verify test at step 1118. A decision step 1120 determines if there is a next program loop. A next program loop may be performed if many memory cells have not completed programming or are otherwise not in the lockout state. If this is true, step 1122 includes stepping up Vpgm, and a next program loop begins at step 1112. If decision step 1120 is false, step 1121 denotes the end of the program operation. The program operation may be ended when all, or nearly all of the memory cells connected to WLn are in the lockout state.

FIG. 12 depicts examples of voltage signals which can be used in a program loop of a program operation, consistent with FIGS. 11A and 11B. The vertical dimension denotes voltage and the horizontal dimension denotes time, with time points t0-t12. The period of time depicted corresponds to one program loop and includes a pre-charge phase 1290 (t0-t2), a program phase 1291 (t2-t8) and a verify phase 1292 (t9-t12). Example voltages of the signals are also depicted. A voltage signal 1200 represents VWLn, the voltage of the selected word line, a plot 1210 represents Vwl_unsel, a voltage of unselected word lines, a plot 1230 represents the select gate voltages, e.g., Vsgd and/or Vsgs, and a voltage signal 1240 represents Vbl, a bit line voltage. Vwl_unsel can represent VWLn−1, the word line adjacent to WLn and preceding WLn in a word line programming order, and the voltage on the remaining unselected word lines. This can include the unselected data word lines.

The voltage signal 1200 is represented by a plot 1201 at an initial value such as 0 V, a plot 1202 representing a first step increase in WLn, from the initial value to an intermediate value, e.g., Vpass, a plot 1203 in which WLn is held at Vpass, a plot 1204 representing a second step increase, from Vpass to Vpgm, a plot 1205 representing a holding period at Vpgm, a plot 1206 representing a decrease from Vpgm to the initial value, and a plot 1207 representing verify voltages of VvE, VvF and VvG, for example.

The voltage signal 1210 is represented by a plot 1211 at an initial value such as 0 V, a plot 1212 representing a first step increase in Vwl_unsel from the initial value to a pass value, e.g., Vpass, and a plot 1213 in which Vwl_unsel is held at Vpass from t3-t4. A plot 1220 depicts Vwl_unsel being held at Vpass before being decreased from Vpass to 0 V at t12. In a first option (plots 1214-1216), VWLn−1 is increased from Vpass to Vpass_el at t4, held at Vpass_el until t6, and decreased from Vpass_el to Vpass at t6. In this option, the increase in WLn−1 to the elevated pass level of Vpass_el begins before the increase in WLn from Vpass to Vpgm at t5-t6.

In a second option (plots 1217-1219), VWLn−1 is increased from Vpass to Vpass_el at t5, held at Vpass_el until t7, and decreased from Vpass_el to Vpass at t7. In this option, the increase in WLn−1 from Vpass to Vpass_el is concurrent with the increase in WLn at t5-t6. In a third option, Vwl_unsel is held at Vpass from t4-t7 (plot 1221). This may be used for WLn−1 in a program loop in which the program disturb countermeasures is not applied, and for remaining unselected word lines in all program loops, in one embodiment.

The voltage signal 1230 is represented by a plot 1231 during the pre-charge for selected and unselected select gate transistors. The selected select gate (SG) transistors are in a selected sub-block (a sub-block selected for programming), and the unselected SG transistors are in unselected sub-blocks (sub-block which are not selected for programming). Subsequently, a plot 1232 with Vsg_sel=2.5 V represents the voltage of the selected SG transistors, and a plot 1233 with Vsg_unsel=2.5 V represents the voltage of the unselected SG transistors.

The voltage signal 1240 is represented by a plot 1241, depicting a voltage Vbl=2 V, during the pre-charge for selected and unselected bit lines. The selected and unselected bit lines are connected to selected and unselected NAND strings, respectively, in a selected sub-block, in one approach. Subsequently, a plot 1242 depicts Vbl_unsel=2 V (a voltage on unselected bit lines), and a plot 1243 depicts Vbl_sel=0 V (a voltage on selected bit lines).

In the pre-charge phase, a positive Vbl (plot 1241) is provided to the drain-side of the channels of the strings to remove residue electrons and to provide a small amount of boosting such as 1-2 V. The SGD transistors of the selected and unselected sub-blocks are in a conductive state at this time, with a voltage of 6 V, for example. This allows the bit line voltage to be passed to the drain end channel. It is also possible for the SGS transistors of the selected and unselected sub-blocks to be in a conductive state at this time, with a voltage of 6 V, for example (plot 1231) to allow the source line voltage (Vsl) to be passed to the source end of the channel In the program phase, VWLn and Vwl_unsel are ramped up, e.g., starting at t2, to provide a capacitive coupling up of the channels of the unselected NAND strings. VWLn is then ramped up further at t5-t6 to the peak program pulse level of Vpgm and held at Vpgm until t8. After the program pulse, VWLn is ramped down to Vss (0 V) at t8. Subsequently, in the verify phase, one or more verify tests are performed by applying one or more control gate read voltages (plot 1207) on WLn and, for each read voltage, sensing the conductive state of the memory cells in the selected NAND strings of the selected sub-block.

During the program and verify phases, Vsg_sel can be set to, e.g., 2.5 V and 0 V, respectively, for the selected sub-block (plot 1232) and the unselected sub-blocks (plot 1233). During the program pulse, with Vbl=0 V (plot 1243), Vsg_sel is high enough to provide the SG_sel transistors in a conductive state for the selected NAND strings. However, it is low enough that the SG_sel transistors can be provided in a non-conductive state for the unselected NAND strings, by setting a high Vbl for those strings. During the program and verify phases, Vbl_unsel can remain high at 2 V for the unselected NAND strings (plot 1242). Vbl_sel can be increased during the verify phase (t9-t12) as part of a sensing process in which the bit lines are charged up.

During the verify phase, the SGD transistor is in a strongly conductive state to allow sensing to occur for the selected memory cell. Thus, the drain-end select gate transistor is in a conductive state during the pre-charge phase and the program phase, for the selected NAND strings. Vsg_unsel is decreased to a reduced level such as 0 V which provides the SG_unsel transistors in a non-conductive state for the strings in the unselected sub-blocks. After the verify phase, at t12, Vbl is decreased to 0 V so that the SGD transistors are cutoff and the channel region has a floating voltage.

This example shows VWLn increasing in a first step from 0 V to Vpass (an intermediate level, between the initial level and the peak program level) and then in a second step from Vpass to Vpgm, while Vpass_el is applied during the second step. Other embodiments are possible. For example, VWLn may increase to an intermediate level different than Vpass. In another example, VWLn may increase in more than two steps, in which case Vpass_el may be applied during the last step, for instance. In another example, VWLn may increase in a single step from the initial level to the peak program level, in which case Vpass_el may be applied during the increase. A single step is typically avoided because it would cause a large increase in the channel gradient and a large amount of the injection type of program disturb.

FIG. 13A depicts an example voltage on WLn−1 (VWLn−1) versus a program loop or program pulse level (Vpgm). As mentioned, VWLn−1 can be temporarily increased to an elevated pass level, Vpass_el, during an increase in VWLn from Vpass to Vpgm, as a program disturb countermeasure. Further, the program disturb countermeasure can be implemented in a later portion of a program operation when Vpgm is relatively high, but not in an earlier portion of a program operation when Vpgm is relatively low. In one approach, plot 1300 shows that VWLn−1 is set to Vpass during an increase in VWLn from Vpass to Vpgm, when the program loop (PL) or Vpgm is below a respective transition level of PL_transition or Vpgm_transition. Plot 1301 shows that VWLn−1 is elevated above Vpass to Vpass_el during an increase in VWLn from Vpass to Vpgm, when the program loop (PL) or Vpgm is at or above PL_transition or Vpgm_transition, respectively. In another option, plot 1302 shows that Vpass_el increases as the PL or Vpgm increases above PL_transition or Vpgm_transition, respectively. This approach adjusts the magnitude of Vpass_el and the corresponding effectiveness of the program disturb countermeasure, as a function of PL or Vpgm, while the single-level Vpass_el of plot 1301 provides a simpler implementation. This figure shows that Vpass_el is an increasing function of PL or Vpgm, e.g., Vpass_el increases when PL or Vpgm increases.

In another option, VWLn−1 is elevated above Vpass in each program loop, but it is elevated to a lower level (plot 1303) before PL_transition or Vpgm_transition compared to a higher level (plot 1301) when PL_transition or Vpgm_transition is reached.

A control circuit may be configured to track a program loop number during a program pass and to provide the voltage on WLn−1 (a first unselected word line) at the elevated pass level (Vpass_el) during the increase of the voltage on the selected word line, in response to the program loop number reaching a transition program loop number.

FIG. 13B depicts an example plot of a transition program loop (PL_transition) or a transition Vpgm (Vpgm_transition) versus a number of program erase (P-E) cycles. As the number of P-E cycles increases for a set of memory cells, the generation of electron-hole pairs in the channel becomes easier because there more dangling bonds created in the channel. As a result, injection disturb on WLn, and Vpass disturb on WLn−1, can both increase. In one approach, injection disturb on WLn will be stronger than Vpass disturb on WLn−1, so that an appropriate countermeasure can include setting PL_transition or Vpgm_transition relatively low when the number of P-E cycles is relatively high, as depicted. Another option is setting Vpass_el relatively high when the number of P-E cycles is relatively high. See FIG. 13E. This figure shows that PL_transition or Vpgm_transition is a decreasing function of a number of P-E cycles.

FIG. 13C depicts an example plot of a PL_transition or Vpgm_transition versus a temperature. The injection type of program disturb is most severe at lower temperatures. Accordingly, the PL_transition or Vpgm_transition which initiates the program disturb countermeasure can be reduced when the temperature is lower, so that the program disturb countermeasure is implemented relatively sooner in the program operation. This figure shows that PL_transition or Vpgm_transition is an increasing function of a temperature.

FIG. 13D depicts an example voltage on WLn−1 (VWLn−1) versus a temperature. Another option to compensating for temperature effects is to increase Vpass_el as the temperature decreases. One option, depicted by plot 1310, is to use a higher Vpass_el (Vpass_el2) when the temperature is below a transition level, Temp_transition, and to use a lower Vpass_el (Vpass_el1) when the temperature is at or above Temp_transition. Another approach, depicted by plot 1311, is to gradually increase Vpass_el as the temperature decreases. This figure shows that Vpass_el is a decreasing function of temperature.

FIG. 13E depicts an example voltage on WLn−1 (VWLn−1) versus a number of P-E cycles. As mentioned in connection with FIG. 13B, this option involves setting Vpass_el relatively high when the number of P-E cycles is relatively high. In one approach, depicted by plots 1320 and 1321, Vpass_el is set to a lower level (Vpass_el1) when the number of P-E cycles is below a transition level, P-E_transition, and to a higher level (Vpass_el2) when the number of P-E cycles is at or above P-E_transition. Another approach (plot 1322) involves gradually increasing Vpass_el as the number of P-E cycles increases above P-E_transition. This figure shows that Vpass_el is an increasing function of a number of P-E cycles.

FIG. 14A depicts an example of bit values in latches at a start of a program operation, consistent with FIG. 11B, step 1111. As mentioned, e.g., in connection with FIG. 2, a set of latches can be associated with each NAND string and thus with each selected memory cell being programmed A bit combination stored in the latches can identify the assigned data state and/or indicate that the memory cell is in a lockout or program state. The bit combinations of 111, 110, 100, 000, 010, 011, 001 and 101 identify the Er, A, B, C, D, E, F and G states, respectively, as assigned data states. The bit combination of 111 also identifies the lockout state. During programming, when the memory cells reach their respective lockout state, the bit combination can be changed to 111 as indicated in FIG. 14B FIG. 14B depicts bit values in latches at a completion of a program operation, consistent with FIG. 11B, step 1119. As mentioned, the bit combination 111 denotes the lockout state.

In one implementation, an apparatus comprises: a set of memory cells arranged in NAND strings, the set of memory cells comprises memory cells connected to a selected word line and memory cells connected to a first unselected word line which is adjacent to the selected word line, and the memory cells connected to the selected word line comprise selected memory cells and unselected memory cells; and a control circuit. The control circuit, to program the selected memory cells in one program loop, is configured to increase a voltage on the selected word line to a program level, to hold the voltage on the selected word line at the program level, to provide a voltage on the first unselected word line at an elevated pass level during the increase of the voltage on the selected word line, and at a nominal pass level, which is lower than the elevated pass level, during the hold of the voltage on the selected word line.

In another implementation, a method comprises: stepping up a voltage on a selected word line from an initial level to a nominal pass level, and from the nominal pass level to a program level, and holding the voltage at the program level; and stepping up a voltage on an unselected word line which is adjacent to the selected word line from an initial level to the nominal pass level, and from the nominal pass level to an elevated pass level which is less than the program level, holding the voltage on the unselected word line at the elevated pass level, stepping down the voltage on the unselected word line from the elevated pass level to the nominal pass level, and holding the voltage on the unselected word line at the nominal pass level, wherein the voltage on the unselected word line is held at the elevated pass level during the stepping up of the voltage on the selected word line from the nominal pass level to the program level.

In another implementation, an apparatus comprise: a set of memory cells, the memory cells are arranged in NAND strings and connected to word lines; means for increasing a voltage on a selected word line to a program level; means for holding the voltage on the selected word line at the program level; means for providing a voltage on an unselected word line at an elevated pass level during the increasing of the voltage on the selected word line; and means for providing the voltage on the unselected word line at a nominal pass level, lower than the elevated pass level, during the holding of the voltage on the selected word line at the program level.

The means for increasing the voltage, the means for holding the voltage at the program level, the means for providing the voltage at the elevated pass level and the means for providing the voltage at the nominal pass level, may include the controller 122, control circuitry 110, including the power control module 115, sense blocks 51-53, row decoder 124 and read/write circuits 128 of FIGS. 1A and 2, or other logic hardware, and/or other executable code stored on a computer readable storage medium or device. Other embodiments may include similar or equivalent means.

The apparatus may further include means for increasing the voltage on the unselected word line to the elevated pass level during the increasing of the voltage on the selected word line, or means for increasing the voltage on the unselected word line to the elevated pass level before the increasing of the voltage on the selected word line. The means for increasing the voltage may include the controller 122, control circuitry 110, including the power control module 115, sense blocks 51-53, row decoder 124 and read/write circuits 128 of FIGS. 1A and 2, or other logic hardware, and/or other executable code stored on a computer readable storage medium or device. Other embodiments may include similar or equivalent means.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:

a set of memory cells arranged in NAND strings, the set of memory cells comprises memory cells connected to a selected word line and memory cells connected to a first unselected word line which is adjacent to the selected word line, and the memory cells connected to the selected word line comprise selected memory cells and unselected memory cells;

a control circuit, the control circuit, to program the selected memory cells in one program loop, is configured to increase a voltage on the selected word line to a program level, to hold the voltage on the selected word line at the program level, to provide a voltage on the first unselected word line at an elevated pass level during the increase of the voltage on the selected word line, and at a nominal pass level, which is lower than the elevated pass level, during the hold of the voltage on the selected word line; and a second unselected word line adjacent to the selected word line, wherein the first unselected word line is programmed before the selected word line, the second unselected word line is programmed after the selected word line, and the control circuit is configured to provide a voltage on the second unselected word line at the nominal pass level during the increase of the voltage on the selected word line and during the hold of the voltage on the selected word line.

2. The apparatus of claim 1, wherein:

the control circuit is configured to increase the voltage on the first unselected word line to the elevated pass level during the increase of the voltage on the selected word line to the program level.

3. The apparatus of claim 1, wherein:

the control circuit is configured to decrease the voltage on the first unselected word line from the elevated pass level to the nominal pass level after the voltage on the selected word reaches the program level.

4. The apparatus of claim 1, wherein:

the control circuit is configured to increase the voltage on the first unselected word line to the elevated pass level from the nominal pass level.

5. The apparatus of claim 1, wherein:

the increase of the voltage on the selected word line comprises a step from an initial level to the nominal pass level, and a step from the nominal pass level to the program level; and an increase of the voltage on the first unselected word line comprises a step from an initial level to the nominal pass level, and a step from the nominal pass level to the elevated pass level.

6. The apparatus of claim 1, wherein:

the one program loop is in a program pass comprising multiple program loops; and the control circuit is configured to track a program loop number during the program pass and to provide the voltage on the first unselected word line at the elevated pass level during the increase of the voltage on the selected word line, in response to the program loop number reaching a transition program loop number.

7. The apparatus of claim 6, wherein:

the transition program loop number is an increasing function of a temperature.

8. The apparatus of claim 6, wherein:

the transition program loop number is a decreasing function of a number of program-erase cycles of the set of memory cells.

9. The apparatus of claim 1, wherein:

a magnitude of the elevated pass level is an increasing function of the program level.

10. The apparatus of claim 1, wherein:

a magnitude of the elevated pass level is a decreasing function of a temperature.

11. The apparatus of claim 1, wherein:

the elevated pass level is up to 30% higher than the nominal pass level; and the program level is at least 50% higher than the nominal pass level.

12. A method, comprising:

stepping up a voltage on a selected word line from an initial level to a nominal pass level, and from the nominal pass level to a program level, and holding the voltage at the program level; and stepping up a voltage on an unselected word line which is adjacent to the selected word line from an initial level to the nominal pass level, and from the nominal pass level to an elevated pass level which is less than the program level, holding the voltage on the unselected word line at the elevated pass level, stepping down the voltage on the unselected word line from the elevated pass level to the nominal pass level, and holding the voltage on the unselected word line at the nominal pass level, wherein the voltage on the unselected word line is held at the elevated pass level from a time before the stepping up of the voltage on the selected word line from the nominal pass level to the program level until a time after the stepping up of the voltage on the selected word line from the nominal pass level to the program level, when the voltage of the selected word line is held at the program level.

13. The method of claim 12, wherein:

the stepping up of the voltage of the unselected word line from the nominal pass level to the elevated pass level occurs in response to a program loop number reaching a transition program loop number in a program pass.

14. The method of claim 12, wherein:

the stepping up of the voltage of the unselected word line from the nominal pass level to the elevated pass level occurs in response to the program level reaching a transition program level in a program pass.

15. The method of claim 12, further comprising:

applying a voltage at the nominal pass level to remaining unselected word lines while the voltage on the unselected word line is held at the elevated pass level.

16. The method of claim 12, further comprising:

holding the voltage on the unselected word line at the nominal pass level after the stepping up the voltage on the unselected word line from the initial level to the nominal pass level, and before the stepping up the voltage on the unselected word line from the nominal pass level to the elevated pass level.

17. An apparatus, comprising:

a set of memory cells, the memory cells are arranged in NAND strings and connected to word lines;

means for increasing a voltage on a selected word line to a program level;

means for holding the voltage on the selected word line at the program level;

means for providing a voltage on a first unselected word line adjacent to and on a source side of the selected word line at an elevated pass level during the increasing of the voltage on the selected word line;

means for providing a voltage on a second unselected word line adjacent to and on a drain side of the selected word line at a nominal pass level, lower than the elevated pass level, during the increasing of the voltage on the selected word line; and means for providing the voltage on the first unselected word line at the nominal pass level during the holding of the voltage on the selected word line at the program level.

18. The apparatus of claim 17, further comprising:

means for increasing the voltage on the first unselected word line to the elevated pass level during the increasing of the voltage on the selected word line.

19. The apparatus of claim 17, further comprising:

means for increasing the voltage on the first unselected word line to the elevated pass level before the increasing of the voltage on the selected word line.

* * * * *